United States Patent
Ryoo et al.

(10) Patent No.: US 11,314,596 B2
(45) Date of Patent: Apr. 26, 2022

(54) ELECTRONIC APPARATUS AND OPERATIVE METHOD

(71) Applicant: Winbond Electronics Corp., Taichung (TW)

(72) Inventors: Pil-Sang Ryoo, Taichung (TW); Wen-Chiao Ho, Taichung (TW)

(73) Assignee: Winbond Electronics Corp., Taichung (TW)

(*) Notice: Subject to any disclaimer, the term of this patent is extended or adjusted under 35 U.S.C. 154(b) by 44 days.

(21) Appl. No.: 16/040,554

(22) Filed: Jul. 20, 2018

(65) Prior Publication Data

US 2020/0026607 A1 Jan. 23, 2020

(51) Int. Cl.
*G06F 11/14* (2006.01)
*G11C 15/04* (2006.01)
*G11C 29/14* (2006.01)

(52) U.S. Cl.
CPC .......... *G06F 11/1441* (2013.01); *G11C 15/04* (2013.01); *G11C 29/14* (2013.01); *G06F 2201/805* (2013.01); *G06F 2201/82* (2013.01)

(58) Field of Classification Search
CPC ..... G11C 11/2273; G11C 15/04; G11C 29/14; G06F 3/0659; G06F 1/3212; G06F 11/1068; G06F 11/0793; G06F 11/0796; G06F 11/14; G06F 11/1402; G06F 11/1438; G06F 11/1441; G09G 2300/0842
See application file for complete search history.

(56) References Cited

U.S. PATENT DOCUMENTS 4,586,179 A * 4/1986 Sirazi .................. G06F 11/1441
714/14
5,402,081 A * 3/1995 Wong ............... H03K 19/01707
327/108
(Continued)

FOREIGN PATENT DOCUMENTS

CN 102520223 6/2012
CN 103093807 5/2013
(Continued)

OTHER PUBLICATIONS

"Office Action of Taiwan Counterpart Application", dated Feb. 27, 2020, p. 1-p. 4.
(Continued)

*Primary Examiner* — Matthew M Kim
*Assistant Examiner* — Matthew N Putaraksa
(74) *Attorney, Agent, or Firm* — JCIPRNET

(57) ABSTRACT

This invention introduces an electronic apparatus and an operative method thereof which are capable of triggering an initialization operation for the electronic apparatus correctly. The electronic apparatus includes a plurality of latches and a power power-on-reset generator. The plurality of latches are coupled to memory cells and are configured to monitor memory data of the memory cells. The power-on-reset generator is coupled to the plurality of latches and is configured to generate a power-on-reset pulse to reset the electronic apparatus in response to a data corruption on at least one of the memory cells. The data corruption is detected during an initialization operation of the electronic apparatus according to memory data of the memory cells and corresponding hardwired code data.

12 Claims, 6 Drawing Sheets

(56) References Cited

U.S. PATENT DOCUMENTS

| | | | |
|---|---|---|---|
| 5,831,470 A * | 11/1998 | Park | H02M 3/073 327/536 |
| 5,940,343 A * | 8/1999 | Cha | G11C 8/08 365/230.06 |
| 6,144,600 A * | 11/2000 | Ogura | G11C 7/12 365/185.25 |
| 6,232,818 B1 * | 5/2001 | Zaliznyak | H04L 25/0266 327/333 |
| 6,895,525 B1 | 5/2005 | Wilkie et al. | |
| 7,257,763 B1 * | 8/2007 | Srinivasan | G06F 11/1064 714/718 |
| 9,406,395 B1 | 8/2016 | Kodama et al. | |
| 9,582,349 B1 * | 2/2017 | Schmit | G11C 29/52 |
| 9,628,061 B2 | 4/2017 | Lu et al. | |
| 2002/0013876 A1 * | 1/2002 | Rosa | G06F 11/1068 711/1 |
| 2004/0052249 A1 * | 3/2004 | Fukuoka | G06F 1/3203 370/362 |
| 2006/0012396 A1 * | 1/2006 | Kim | H03K 19/01721 326/81 |
| 2010/0054054 A1 * | 3/2010 | Kim | G11C 11/413 365/191 |
| 2010/0271057 A1 | 10/2010 | Cannon et al. | |
| 2011/0090203 A1 * | 4/2011 | Cho | H03K 3/356113 345/211 |
| 2011/0181339 A1 * | 7/2011 | Kikuchi | H03K 19/018521 327/333 |
| 2013/0162458 A1 * | 6/2013 | Nishiki | H03M 1/56 341/166 |
| 2013/0300394 A1 * | 11/2013 | Wang | H02M 3/158 323/311 |
| 2015/0318033 A1 * | 11/2015 | Kajigaya | G11C 29/52 714/764 |
| 2018/0026549 A1 * | 1/2018 | Xu | H02M 7/487 363/97 |
| 2018/0183434 A1 * | 6/2018 | Kowkutla | H03B 5/32 |
| 2019/0095570 A1 * | 3/2019 | Hutton | G06F 11/1417 |

FOREIGN PATENT DOCUMENTS

| | | |
|---|---|---|
| CN | 104461947 | 3/2015 |
| CN | 104620194 | 1/2018 |
| CN | 111091856 | 5/2020 |
| JP | 2010224954 | 10/2010 |
| TW | I299161 | 7/2008 |

OTHER PUBLICATIONS

"Office Action of China Counterpart Application", dated Apr. 2, 2021, p. 1-p. 10.

* cited by examiner

ELECTRONIC APPARATUS AND OPERATIVE METHOD

BACKGROUND OF THE INVENTION

1. Field of the Invention

The invention relates to an electronic apparatus and an operative method, and particularly relates to an electronic apparatus and an operative method which are capable of triggering an initialization operation for the electronic apparatus correctly.

2. Description of Related Art

Nowadays, memory devices are widely used to store data in numerous electronic apparatuses. Among different memory types, content-addressable memory (CAM) are preferable for applications that require relatively high speed searching for data. However, one of critical issues that cause a corruption of stored data in the memory devices are sudden power loss or too low power drop. Therefore, it is necessary to detect the power drop and trigger a power-on-reset (POR) signal to reset the electronic apparatus correctly, thereby recovering the corrupted data and improving the reliability of the electronic apparatus.

SUMMARY OF THE INVENTION

This invention introduces an electronic apparatus and an operative method which are capable of triggering correctly an initialization operation for the electronic apparatus.

The electronic apparatus includes a plurality of latches and a POR generator. The plurality of latches are coupled to the memory cells and are configured to monitor memory data of the memory cells. The POR generator is coupled to the plurality of latches and are configured to generate a POR pulse to reset the electronic apparatus in response to a data corruption on at least one of the memory cells. The data corruption is detected during an initialization operation of the electronic apparatus according to memory data of the memory cells and corresponding hardwired code data.

The operative method includes steps of monitoring memory data sensed from a plurality of memory cells; detecting a data corruption during an initialization operation of the electronic apparatus according to the memory data and corresponding hardwired code data; and generating a power-on-reset (POR) pulse to reset the electronic apparatus according to the detected data corruption.

In some embodiments of the invention, when memory data is corrupted due to power drop, the POR pulse is generated to reset the electronic apparatus so as to recover the corrupted memory data. In this way, the corrupted memory data may be recovered and the reliability the electronic apparatus are improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
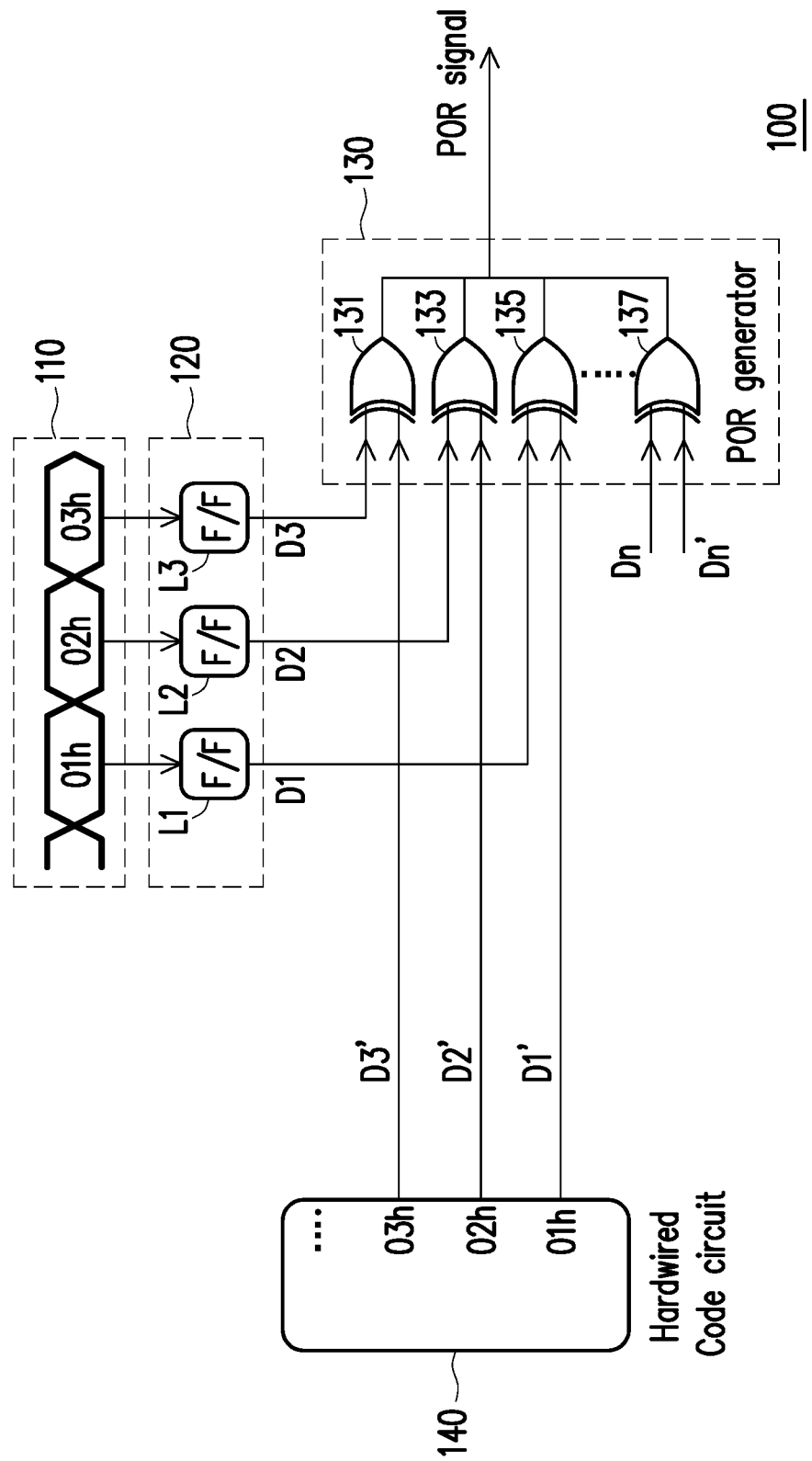
FIG. 1 illustrates a schematic diagram of an electronic apparatus according to an embodiment of the invention.

Referring to FIG. 1, an electronic apparatus 100 may include a memory array 110, a latch circuit 120, a power-on-reset (POR) generator 130 and a hardwired code circuit 140. The memory array 110 may include a plurality of memory cells which are configured to store memory data. Each of the memory cells is associated with one of the memory addresses such as 01h, 02h and 03h. In some embodiments of the invention, the memory cells are content addressable memory (CAM) cells, but the invention is not limited to any specific type of the memory.

The latch circuit 120 may include a plurality of latches L1, L2 and L3, where each of the latches L1, L2 and L3 corresponds to one of the memory cells and each of the latches L1, L2 and L3 is configured to monitor memory data of the corresponding memory cell. For example, the latch L1 corresponds to the memory cell at the address 01h and is configured to monitor the memory data D1 stored in the corresponding memory cell; the latch L2 corresponds to the memory cell at the address 02h and is configured to monitor the memory data D2 stored in the corresponding memory cell; and the latch L3 corresponds to the memory cell at the address 03h and is configured to monitor the memory data D3 stored in the corresponding memory cell. The latch circuit 120 may provide the memory data D1 to D3 which are monitored by the latches L1 to L3 to the POR generator 130.

In some embodiments of the invention, the electronic apparatus 100 may further include a sense amplifier (not shown) that is configured to sense the memory data of the memory cells. The sense amplifier may output the sensed memory data to the latches L1 to L3 of the latch circuit 120 so that the latch circuit 120 may monitor the memory data stored in the memory cells of the memory array 110.

The hardwired code circuit 140 is configured to provide hardwired code data D1' to D3' corresponding to memory data D1 to D3 which are monitored by the latches L1 to L3, respectively to the POR generator 130. For example, the hardwired code circuit 140 may provide the hardwired code data D1' corresponding to the memory data D1, the hardwired code data D2' corresponding to the memory data D2, and the hardwired code data D3' corresponding to the memory data D3 to the POR generator 130.

The POR generator 130 may include a plurality of logical circuits which may be exclusive-OR (XOR) circuits 131 to 137 in some embodiments of the invention. Each of the XOR circuits 131 to 137 may receive the memory data monitored by one of the latches L1 to L3 and the corresponding hardwired data provided by the hardwired code circuit 140. As illustrated in FIG. 1, the XOR circuit 135 receives the memory data D1 monitored by the latch L1 and the corresponding hardwired code data D1', and performs the XOR operation on the received data D1 and D1' to output a result. When the memory data D1 are the same as the corresponding hardwired code data D1', the XOR circuit 135 outputs a low-logical value (e.g., logical value of 0). In contrast, when the memory data D1 are different from the corresponding hardwired code data D1', the XOR circuit 135 outputs a high-logical value (e.g., logic value of 1). Similarly, the XOR circuit 133 is configured to perform the XOR operation on the memory data D2 and the corresponding hardwired code data D2' to output a result. The operation of the other XOR circuits may be deduced by analogy, and the detailed description is omitted herein. In this way, when memory data stored in any memory cell is corrupted (e.g., when the memory data is different from the corresponding hardwired code data), the XOR circuit will output the high-logical value so that a POR pulse is generated to reset the electronic apparatus.

It should be noted that the logical circuits of the POR generator are not limited to the XOR circuit. Other logical circuits fall within the scope of the invention as long as the other logical circuits may detect a difference between the memory data and the corresponding hardwired code data.

In some embodiment of the invention, the POR 130 is configured to generate a p POR pulse (or a POR signal) in response to a corruption of memory data in at least one the memory cells. The POR 130 may generate the POR signal when at least one of XOR circuits 131 to 137 outputs a pre-defined logical value. For example, if at least one of the XOR circuits 131 to 137 outputs the high-logical value (e.g., logical value of 1) indicating that the memory data are different from the corresponding hardwired code data, the POR pulse is generated. As such, when the voltage drop causes the corruption of the memory data stored in a memory cell, the POR signal is generated to trigger an initialization process to initialize the electronic apparatus no matter how low level of the voltage drop. In this way, the corrupted data may be recovered.

Figure 2:
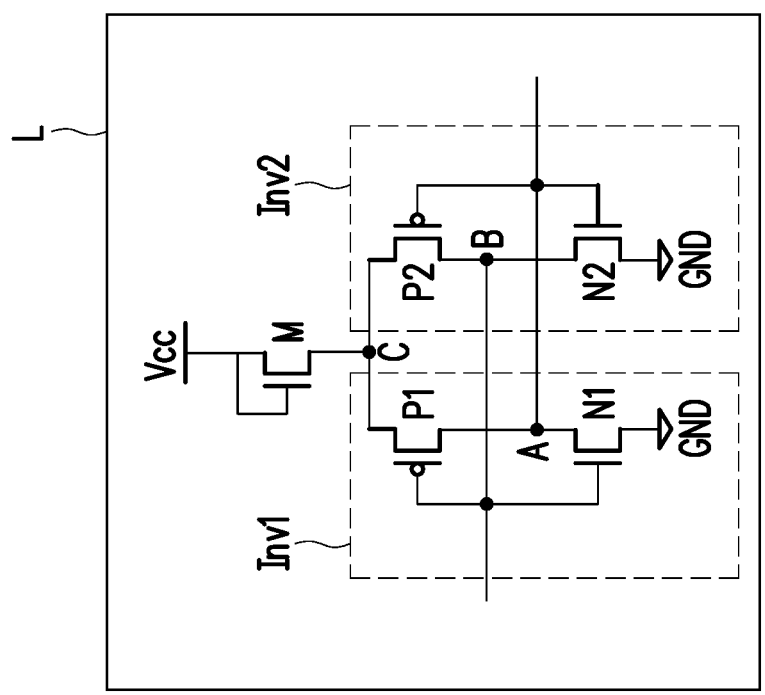
FIG. 2 illustrates an exemplary structure of a latch of an electronic apparatus according to some embodiments of the invention.

Referring to FIG. 2, a detailed structure of a latch L of the latch circuit 120 in an embodiment of the invention is illustrated. The latch L includes a transistor M, inverters Inv1 and Inv2, where the control terminal of transistor M is coupled to the drain terminal of the transistor M so that the voltage Vcc provided at the drain of the transistor M is dropped for the threshold voltage Vth of the transistor M. In other words, the voltage at the source terminal (or node C) of the transistor M is Vcc-Vth. The inverters Inv1 and Inv2 are operated with the operating supply voltage Vcc being dropped by the threshold voltage Vth (Vcc-Vth). As such, the data corruption due to a power drop may be detected earlier, and the electronic apparatus may be reset to prevent the data corruption in the memory cells.

The inverter Inv1 is coupled back-to-back to the inverter Inv2. In other words, an output of the inverter Inv1 is input to the inverter Inv2; and the output of the inverter Inv2 is input back to the inverter Inv1. The inverter Inv1 may include a p-type transistor P1 and a n-type transistor N1; and the inverter Inv2 may include a p-type transistor P2 and a n-type transistor N2. The control terminals of P1 and N1 are coupled to a node B that electrically connects to a drain terminal of P2 and a drain terminal of N2. The control terminals of P2 and N2 are coupled to a node A that electrically connects to a drain terminal of P1 and a drain terminal of N1. The invention is not limited to any specific type of the transistor P1, P2, N1 and N2.

Figure 3:
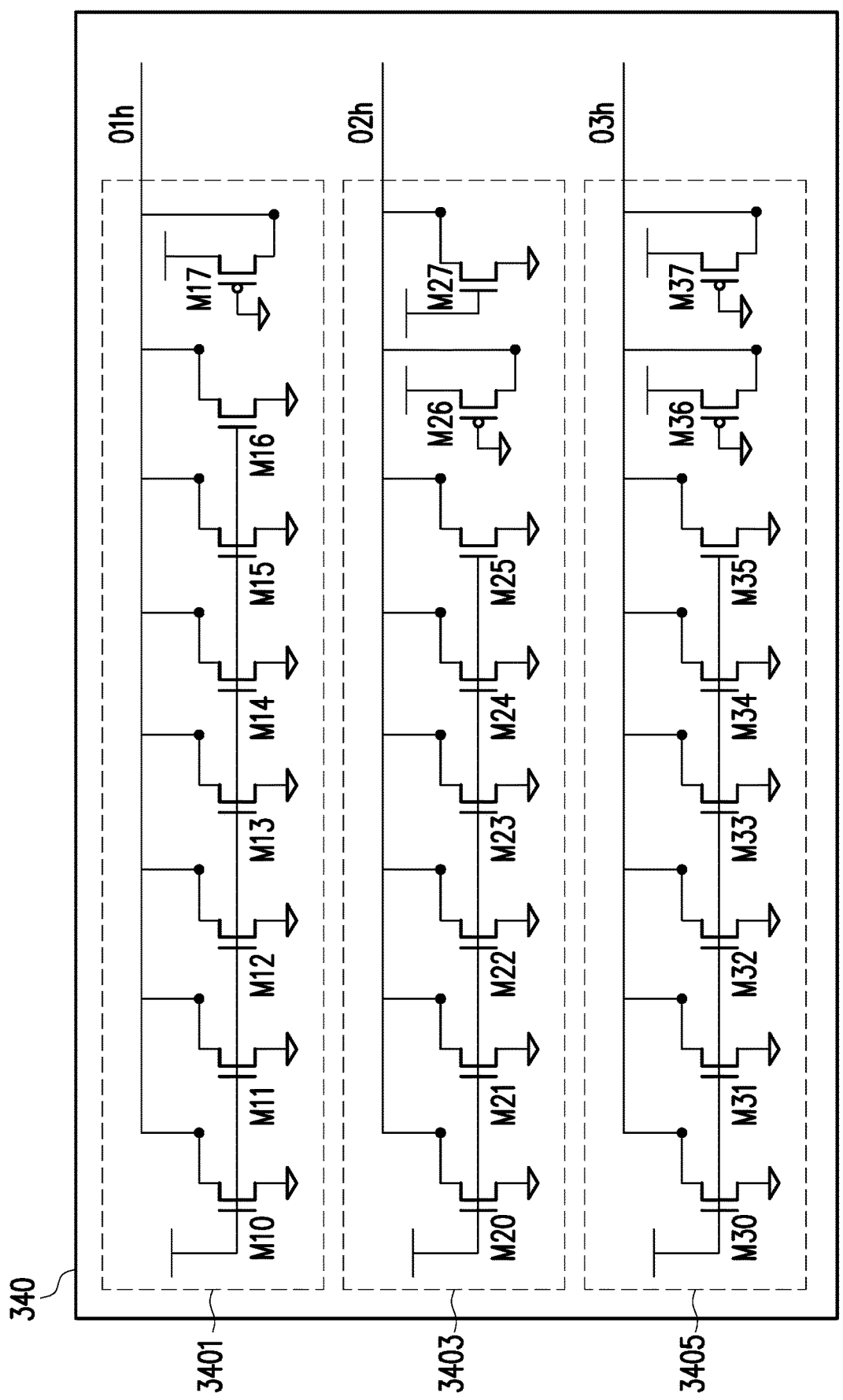
FIG. 3 illustrates an exemplary structure of a hardwired code circuit of an electronic apparatus according to an embodiment of the invention.

Referring to FIG. 3, an exemplary structure of a hardwired code circuit 340 is illustrated. The hardwired code circuit 340 may include a plurality of transistors arranged in transistor groups 3401 to 3405 for providing the hardwired code data to the POR generator. The transistor group 3401 includes transistors M10 to M17; the transistor group 3403 includes transistors M20 to M27; and the transistor group 3405 includes transistors M30 to M37. As an example shown in FIG. 3, the transistor group 3401 provides the hardwired code data to the memory cell corresponding to the address 0h1; the transistor group 3402 provide the hardwired code data to the memory cell corresponding to the address 02h; and the transistor group 3405 provides the hardwired code data to the memory cell corresponding to the address 03h. It should be noted that the structure of hardwired code circuit 340 is not limited to the structure illustrated in FIG. 3. Any structure of the hardwired code circuit 340 falls within the scope of the invention as long as the hardwired code circuit 340 may provide the hardwired code data corresponding to the memory cells to the POR generator.

Figure 4:
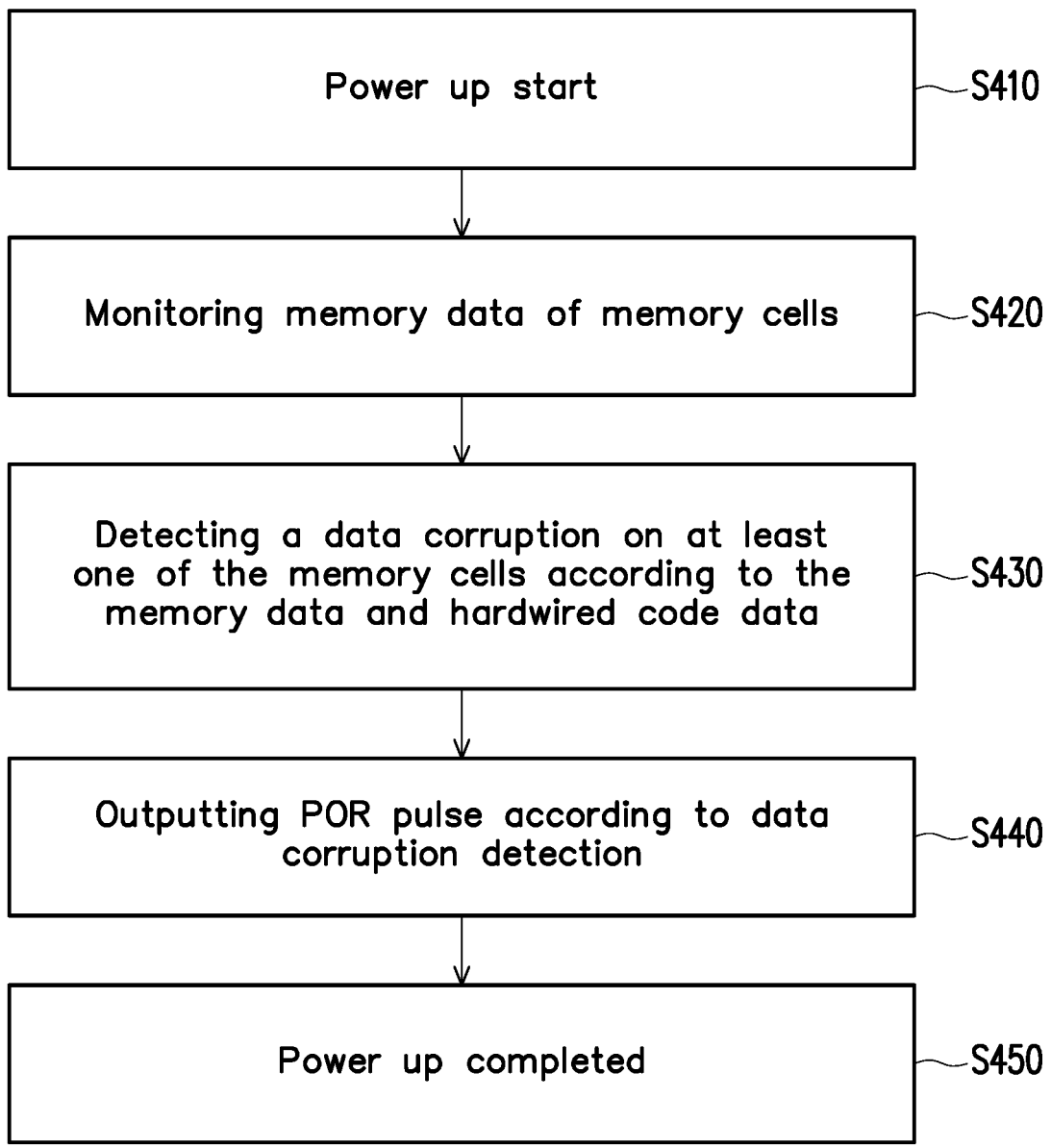
FIG. 4 is a flowchart illustrating a series of steps during an initialization operation of an electronic apparatus according to an embodiment of the invention.

FIG. 4 illustrates a series of steps during the initialization operation (or power-up operation) according to some embodiments of the invention. Referring to FIG. 1 and FIG. 4, after the power is turned on (step S410), the memory data of the memory cells are monitored by the latches L1 to L3 (step S420). Next, a data corruption on at least one of the memory cells is detected according to the memory data and the corresponding hardwired code data in steps S430. The memory data are monitored by the latches L1 to L3 and the corresponding hardwired data are provided by the hardwired code circuit 140. In steps S440, the POR generator 130 may generate a POR pulse according to the detected data corruption. The initialization operation is completed at the step S450. As such, the electronic apparatus may detect the data corruption due to power drop in the memory cells and output the POR pulse to reset the electronic apparatus during the initialization process.

Figure 5A:
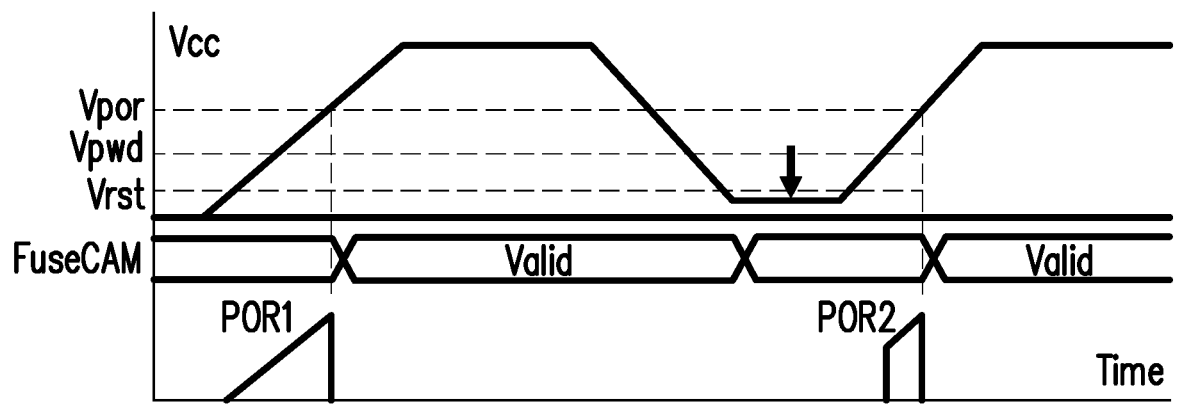
FIG. 5A to FIG. 5C illustrate some examples of power drops according to some embodiments of the invention.
Figure 5B:
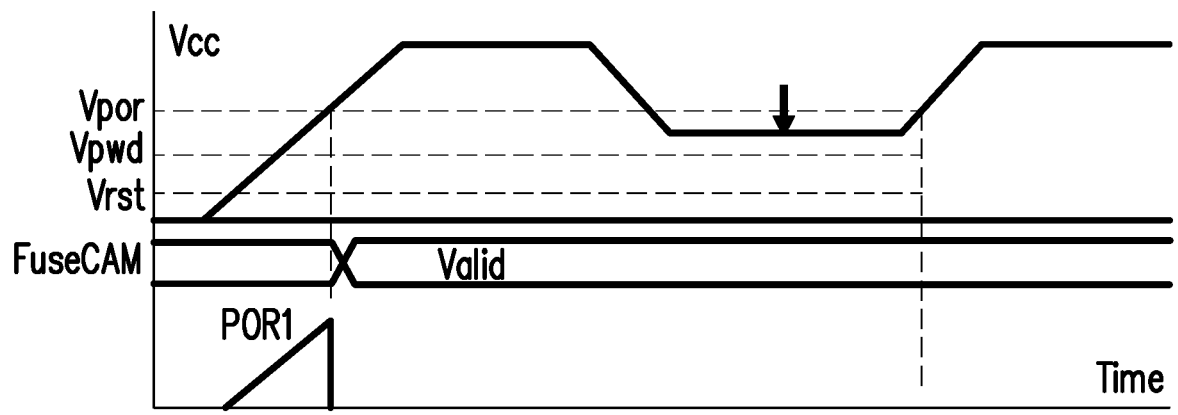
Figure 5C:
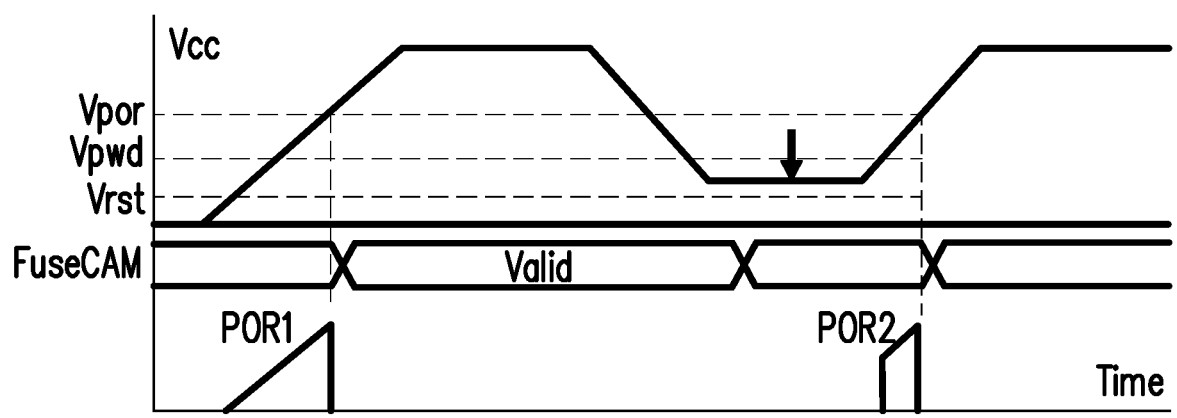

FIG. 5A to FIG. 5C illustrate some examples of power drops according to some embodiments of the invention. The arrows in FIG. 5A to FIG. 5C indicate the occurrence of a power drops on the supplying voltage Vcc. Referring to FIG. 5A, a first POR pulse POR1 is generated when the supplying voltage Vcc reach a POR threshold voltage Vpor. When the operating supply voltage Vcc is dropped to a reset-triggering level Vrst, the memory data that are stored in at least one of memory cells are corrupted (FuseCAM is invalid). In this case, the data corruption in at least one of memory cells will be detected by the electronic apparatus (e.g., electronic apparatus 100 as shown in FIG. 1), and the second POR pulse POR2 will be generated to reset the electronic apparatus, thereby recovering the corrupted data.

Referring to FIG. 5B, when the operating supply voltage Vcc is dropped to a level that is higher than a power-down level Vpwd, the memory stored in the memory cells are not corrupted, and the second POR pulse POR2 is not generated. It should be noted that the power-down level Vpwd is higher than the reset-triggering level Vrst and lower than the POR level Vpor.

Referring to FIG. 5C, when the operating supply voltage Vcc is dropped to a level that is higher than the reset-triggering level Vrst and lower than the power-down level Vpwd, the memory data stored in at least one of memory cells will be corrupted (FuseCAM is invalid). In this case, even though the operating supply voltage Vcc has not dropped to the reset-triggering level Vrst, the memory data stored in the memory cells are still corrupted. The data corruption in at least one of memory cells will be detected by the electronic apparatus (e.g., electronic apparatus 100 as shown in FIG. 1), and the second POR pulse POR2 will be generated to reset the electronic apparatus, thereby recovering the corrupted data.

From FIG. 5A to FIG. 5C, the electronic apparatus will generate the second POR pulse POR2 when the memory data stored in the at least one of the memory cells are corrupted. As such, regardless of how much the power drop level is, the POR pulse POR2 is generated to reset the electronic apparatus as long as the memory data are corrupted.

Figure 6:
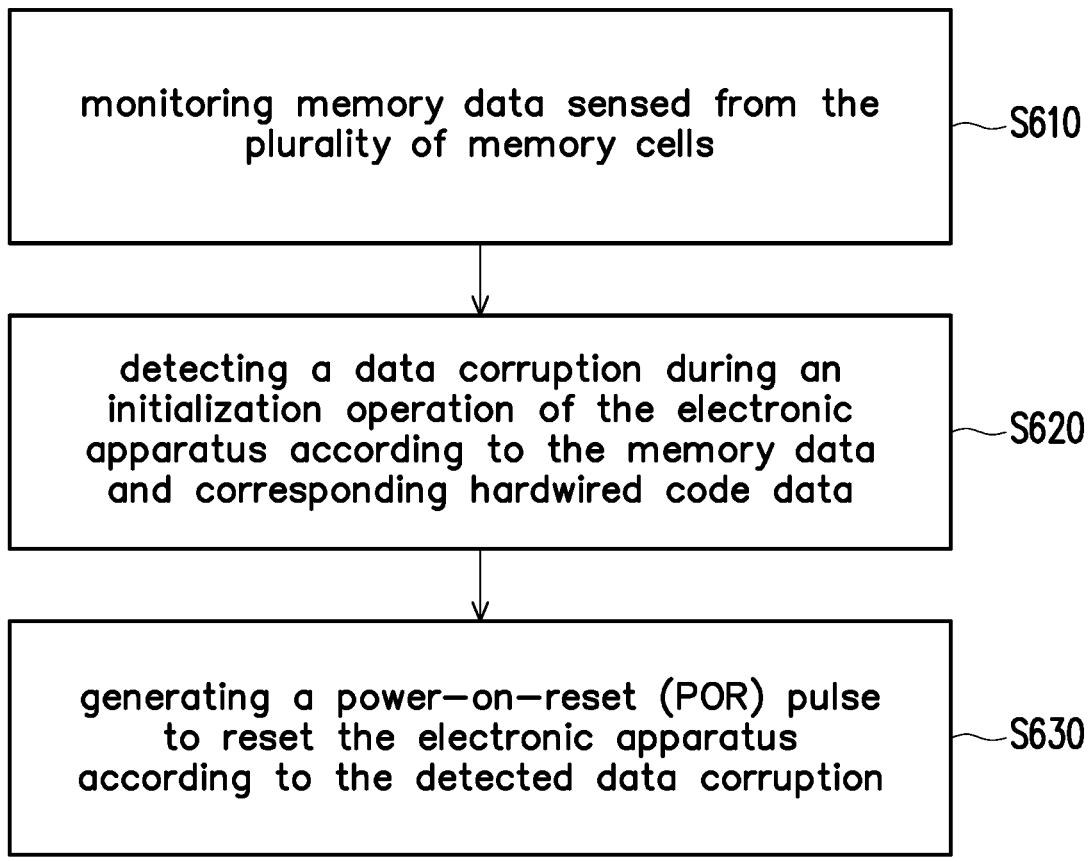
FIG. 6 illustrates an operative method according to an embodiment of the invention.

Referring to FIG. 6, an operative method according to an embodiment of the invention is illustrated. In step S610, the memory data sensed from the plurality of memory cells are monitored. For example, the plurality of latches as shown in FIG. 1 may be used to monitor the memory data sensed from the plurality of memory cells. In step 620, a data corruption is detected during an initialization operation of the electronic apparatus according to the memory data and corresponding hardwired code data. For example, the POR generator in FIG. 1 may detect data corruption in each of the memory cells according to the memory data of the memory cell and the corresponding hardwired code data. In step S630, a POR pulse is generated to reset the electronic apparatus according to the detected data corruption. If the data correction is detected in at least one of the memory cells, the POR pulse is generated to reset the electronic apparatus, thereby preventing the loss of the data.

In some embodiments of the invention, an electronic apparatus and an operative method are introduced for triggering correctly an initialization operation for the electronic apparatus, thereby preventing data loss in memory cells of the electronic apparatus. A data corruption in at least one of the memory cell is detected according to memory data which are monitored by a plurality of latches and corresponding hardwired code data which are provided by a hardwired code circuit. A POR pulse is generated in response to the detection of the data corruption in at least one of the memory cell to reset the electronic apparatus, thereby recovering the corrupted memory data. The plurality of latches may be operated with a pre-set operating supply voltage being dropped by a threshold voltage, so that the data corruption is detected earlier to reset the electronic apparatus earlier. Since data corruption is detected according to the memory data stored in the memory cell, the data corruption is always detected regardless of how low the power drop level is.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic apparatus having a plurality of memory cells, comprising:
   a plurality of latches, coupled to the memory cells, and are configured to monitor memory data of the memory cells, wherein each of the plurality of latches comprises a plurality of inverters and a transistor having a threshold voltage, the transistor is directly connected between a pre-set operating supply voltage and power terminals of the plurality of inverters, and an operating voltage of the plurality of inverters is equal to a voltage difference between the pre-set operating supply voltage and the threshold voltage; and
   a power-on-reset generator, coupled to the plurality of latches, configured to generate a power-on-reset pulse to reset the electronic apparatus in response to a data corruption on at least one of the memory cells, wherein the power-on-reset generator is configured to determine whether memory data stored in the at least one of the memory cells are different from hardwired code data corresponding to the at least one of the memory cells after a power is turned on and generate the power-on-reset pulse when the memory data stored in the at least one of the memory cells are different from the hardwired code data corresponding to the at least one of the memory cells.

2. The electronic apparatus of claim 1, wherein the memory cells are content-addressable memory cells.

3. The electronic apparatus of claim 1, wherein each of the plurality of latches further comprises:
   a first inverter; and
   a second inverter, coupled the first inverter,
   wherein the transistor is coupled to the first inverter and the second inverter, an output terminal of the first inverter is coupled to an input terminal of the second inverter, an input terminal of the first inverter is coupled to an output terminal of the second inverter, and the first inverter and the second inverter are operated with the pre-set operating supply voltage being dropped by the threshold voltage.

4. The electronic apparatus of claim 3, wherein a control terminal of transistor is coupled to a drain terminal of the transistor.

5. The electronic apparatus of claim 1, further comprising:
   a hardwired code circuit, coupled to the power-on-reset generator, and configured to provide the hardwired code data to the power-on-reset generator.

6. The electronic apparatus of claim 5, wherein
   the power-on-reset generator comprises a plurality of logical circuits,
   each of the plurality of the logical circuits is coupled to one of the plurality of latches and the hardwired code circuit to receive the memory data monitored by the one of the plurality of latches and the corresponding hardwired code data, and configured to perform a logical operation on the received memory data and the received hardwired code data to output a result, and
   the power-on-reset pulse is generated according to the result of the logical operation.

7. The electronic apparatus of claim 1, wherein the logical circuit is an exclusive-OR circuit, and the logical operation is an exclusive-OR operation.

8. The electronic apparatus of claim 1, wherein the power-on-reset generator generates the power-on-reset pulse when the operating voltage reaches a power-on-reset threshold voltage less than the pre-set operating supply voltage and the memory data stored in the at least one of the memory cells are different from the hardwired code data corresponding to the at least one of the memory cells.

9. An operative method adapted to an electronic apparatus having a plurality of memory cells, comprising:

monitoring, by a plurality of latches, memory data sensed from the plurality of memory cells;

detecting a data corruption during an initialization operation of the electronic apparatus according to the memory data and corresponding hardwired code data by determining whether memory data stored in the at least one of the memory cells are different from hardwired code data corresponding to the at least one of the memory cells; and generating a power-on-reset pulse to reset the electronic apparatus when the memory data stored in the at least one of the memory cells are different from the hardwired code data corresponding to the at least one of the memory cells, wherein memory data sensed from the memory cells are monitored by the plurality of latches, each of the plurality of latches comprises a plurality of inverters and a transistor having a threshold voltage, the transistor is directly connected between a pre-set operating supply voltage and power terminals of the plurality of inverters, and an operating voltage of the plurality of inverters is equal to a voltage difference between the pre-set operating supply voltage and the threshold voltage.

10. The operative method of claim 9, wherein the steps of detecting the data corruption and outputting the power-on-reset pulse comprise:

performing a logical operation on the memory data and the corresponding hardwired code data to obtain a result; and generating the power-on-reset pulse according to the result of the logical operation.

11. The operative method of claim 10, wherein the logical operation is an exclusive-OR operation.

12. The operative method of claim 9, wherein the step of generating the power-on-reset pulse to reset the electronic apparatus further comprises:

generating the power-on-reset pulse to reset the electronic apparatus when the operating voltage reaches a power-on-reset threshold voltage less than the pre-set operating supply voltage and the memory data stored in the at least one of the memory cells are different from the hardwired code data corresponding to the at least one of the memory cells.

* * * * *